United States Patent [19]

Grandfield

[11] Patent Number: 4,862,015
[45] Date of Patent: Aug. 29, 1989

[54] CONSTANT PROPAGATION DELAY CURRENT REFERENCE

[75] Inventor: Walter J. Grandfield, Lake Worth, Fla.

[73] Assignee: Motorola, Inc., Schaumburg, Ill.

[21] Appl. No.: 163,909

[22] Filed: Mar. 3, 1988

[51] Int. Cl.[4] .......................... H03K 3/01; G05F 3/16
[52] U.S. Cl. .................................. 307/270; 307/296.6; 323/315; 328/140; 331/1 R
[58] Field of Search ............... 307/591, 459, 270, 297, 307/271; 328/55, 140, 141; 330/288; 323/312, 315; 331/1 R, 17, 18, 25, 57

[56] References Cited

U.S. PATENT DOCUMENTS

| | | | |
|---|---|---|---|
| 4,216,396 | 8/1980 | Gillberg et al. | 307/270 |
| 4,329,637 | 5/1982 | Davis | 330/288 |

Primary Examiner—Stanley D. Miller
Assistant Examiner—Timothy P. Callahan
Attorney, Agent, or Firm—Philip P. Macnak; Vincent B. Ingrassia

[57] ABSTRACT

A constant propagation delay current reference is provided having an external source providing a reference frequency signal. A phase lock loop is provided which is responsive to the reference frequency signal and to an operating frequency signal to provide a current reference signal at the output of the loop. The current reference signal is provided to a current to frequency converter which generates the operating frequency signal. A current mirror, also coupled to the phase lock loop output provides an output current proportional to the current reference signal which is suitable for providing the injector current for $I^2L$ devices. The output current tracks the process, voltage and temperature variations of the integrated circuit, allowing the injector currents to be optimized for maintaining constant propagation delay in the circuits being powered.

15 Claims, 2 Drawing Sheets

CONSTANT PROPAGATION DELAY CURRENT REFERENCE

FIELD OF THE INVENTION

This invention relates to current references for use in integrated circuit applications, and more particularly to a current reference providing a constant propagation delay for integrated injection logic (I²L) devices.

BACKGROUND OF THE INVENTION

Integrated circuit designs have relied on current references with current mirrors for biasing transistor gain and logic stages. Numerous current references have been devised to improve the performance of integrated circuits. One example of a current reference utilizing current mirrors for biasing is described in U.S. Pat. No. 4,329,639 to Davis entitled "Low Voltage Current Mirror", the basic circuit being shown in FIG. 1, and labelled prior art. While this current reference has been used successfully for many years in conventional bipolar integrated circuit designs, it and other circuit designs have not proven to be optimal when used in integrated circuits utilizing I²L devices. This non-optimal operation is largely due to the fact the current delivered by the reference does not track the injector current requirements of I²L devices. The lack of tracking is due to processing, operating voltage and temperature variations which is required to maintain constant propagation delays in the circuits being powered. In order to compensate for these variations, prior art current references provided injector currents as much as 2.5 times higher than required to guarantee circuit performance over all processing and operating conditions. This resulted in substantially higher current consumption than actually required when employing I²L circuit designs.

There remains a need for a current reference that is capable of compensating for processing and temperature and operating voltage variations for I²L devices.

SUMMARY OF THE INVENTION

It is therefore an object of the present invention to provide a current reference suitable for use with I²L devices.

It is a further object of the present invention to provide a current reference that compensates for processing, temperature and voltage variations.

It is a further object of the present invention to provide a current reference that can maintain constant propagation delays in the circuits being powered.

These objects and others which will become apparent are provided with a constant propagation delay current reference having an external source providing a reference frequency signal. A phase lock loop is provided which is responsive to the reference frequency signal and to an operating frequency signal to provide a current reference signal at the output of the loop. The current reference signal is provided to a current to frequency converter which generates the operating frequency signal. A current mirror, also coupled to the phase lock loop output provides an output current essentially equal to the current reference signal which is suitable for providing the injector current for I²L devices. The output current tracks the process, voltage and temperature variations of the integrated circuit, allowing the injector currents to be optimized for maintaining constant propagation delay in the circuits being powered.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

DESCRIPTION OF THE PREFERRED EMBODIMENT

Figure 1:
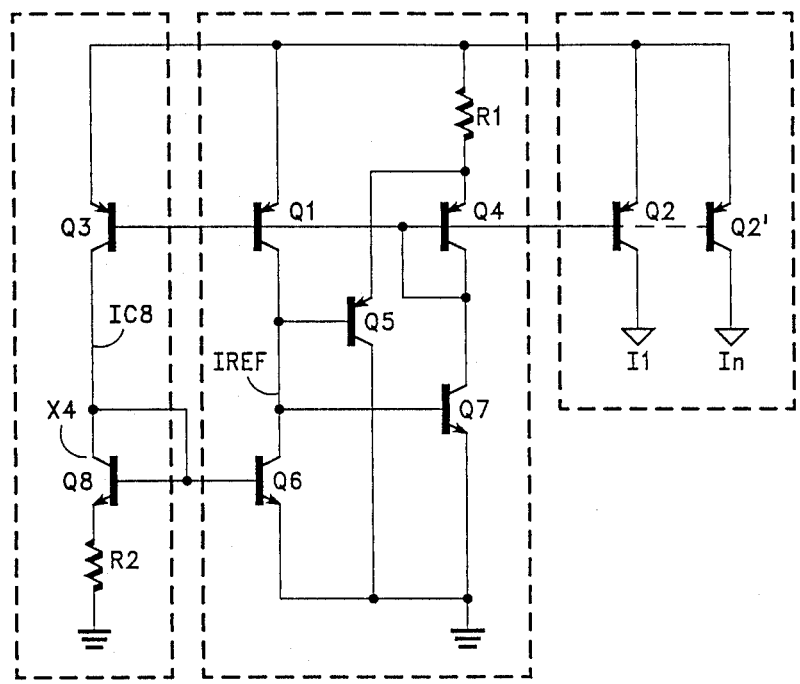
FIG. 1 is an electrical schematic diagram showing a prior art current reference suitable for use with bipolar integrated circuits.
Figure 2:
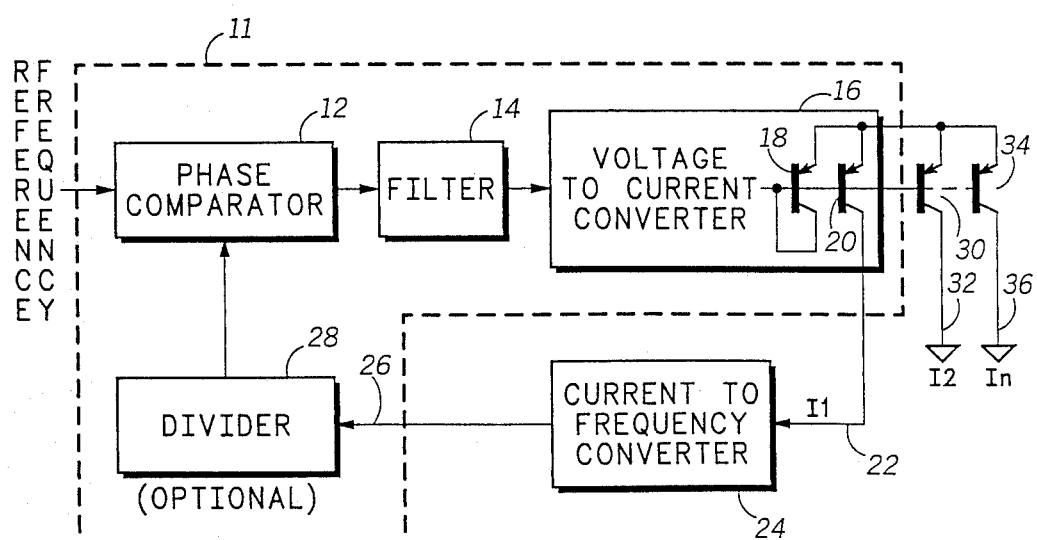
FIG. 2 is a block diagram showing the preferred embodiment of the present invention.
Figure 3:
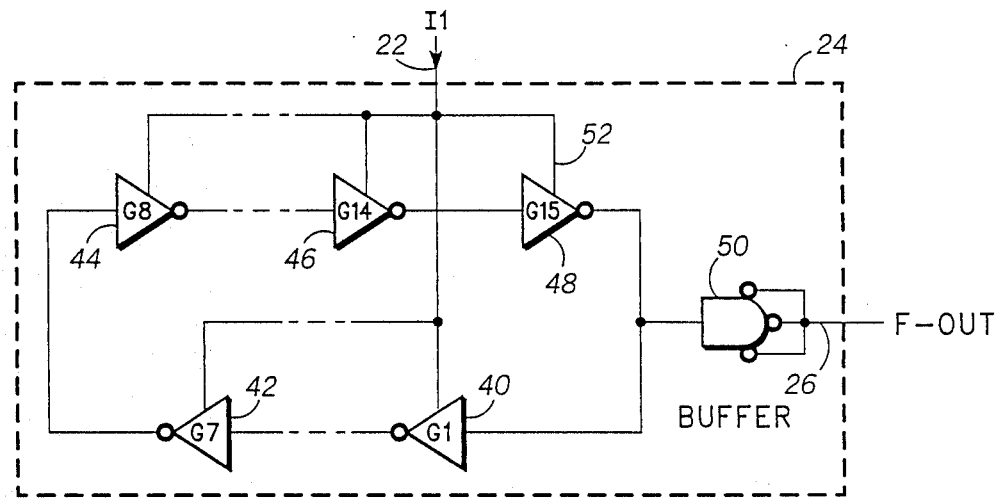
FIG. 3 is an electrical schematic diagram of the current to frequency converter used in the preferred embodiment of the present invention.
Figure 4:
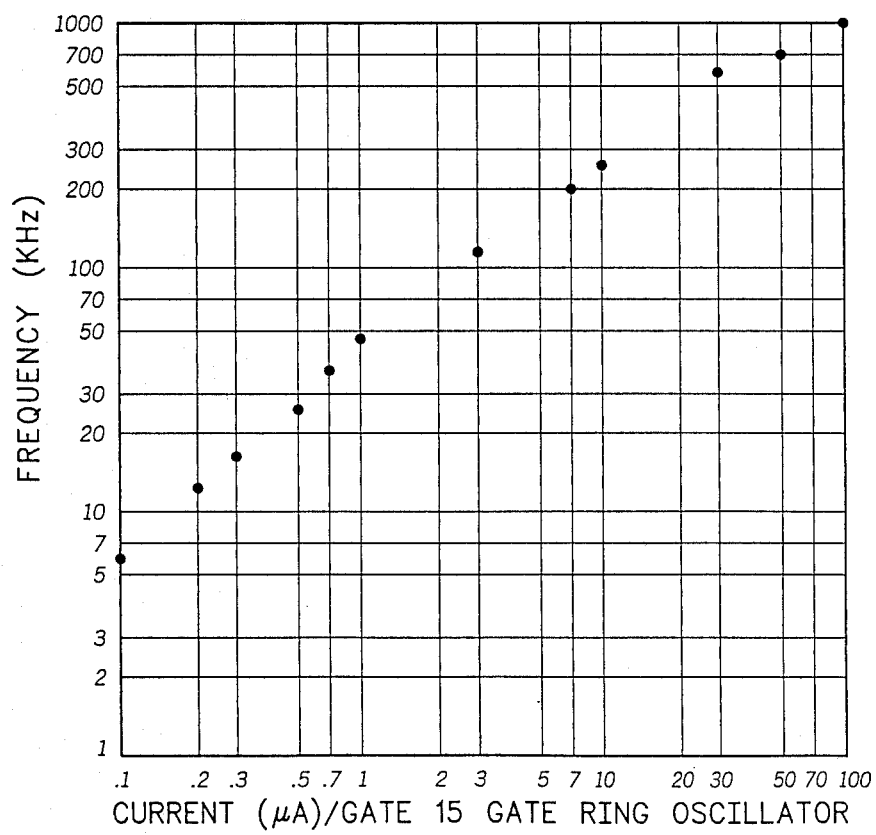
FIG. 4 is a graph showing the current versus frequency characteristics of the current to frequency converter circuit of the preferred embodiment of the present invention.

With respect to the figures, FIGS. 2 through 4 illustrate the preferred embodiment for the present invention. FIG. 2 shows a block diagram of the present invention. A phase locking means 11 is provided having a reference frequency input into phase comparator 12, and an operating frequency input designated 26. The design of phase comparator 12 is well known to one of ordinary skill in the art. When the operating frequency input of phase locking means 11 is at the same frequency as the reference frequency, an output current is generated by phase locking means 11, as will be described in detail later, which provides a constant propagation delay operation for the circuits being powered.

The operating frequency input 26 is normally coupled directly to the second input of phase comparator 12. However, there are instances when the reference frequency provided is lower than the required operating frequency, as happens when an inexpensive 32,768 Hz watch crystal is used to provide the reference frequency. In this instance, a divider 28 is provided to divide the operating frequency 26 of phase locking means 11, so as to generate an equivalent operating frequency which compares to the lower reference frequency. When divider 28 is present, divider 28 is set to generate even multiple divisors, such as by-two or by-four, although it will be appreciated there may be instances where higher multiple divisors are required.

The output of phase comparator 12 couples into a low pass filter 14, providing at its output a filtered phase voltage signal, as is well known to one of ordinary skill in the art. Filter 14 converts the output pulses generated by phase comparator 12 into an essentially DC voltage. This DC voltage, or filtered phase voltage signal, is coupled into a voltage to current converter 16. Voltage to current converters suitable for use in integrated circuits are well known to one of ordinary skill in the art.

Included at the output of voltage to current converter 16 is a current mirror consisting of diode connected PNP transistor 18 and a second PNP transistor 20, or mirroring device. Diode connected PNP transistor 18 establishes a reference voltage across its base emitter junction corresponding to the current supplied by voltage to current converter 16. The second PNP transistors 20, has its base connected to the base of transistor 18, with its emitter connected to supply voltage, and the collector connected to input 22 of current to frequency converter 24. Since transistors 18 and 20 are processed on the same integrated circuit, current $I_1$ essentially matches the current through diode connected transistor 18. Current $I_1$, or current reference signal, is supplied to current to frequency converter 24.

Additional current mirroring devices, such as PNP transistors 30-34 are also coupled to the output current mirror of voltage to current converter 16. As with current $I_1$, output currents $I_2$-$I_N$ are generated at collectors 32 and 36 of transistors 30 and 34 respectively. The output currents $I_2$-$I_N$ essentially match current reference signal $I_1$ and they provide sources of injector current for I²L devices which can maintain a constant propagation delay in the circuits being powered.

FIG. 3 shows the electrical schematic diagram of current to frequency converter 24. Current to frequency converter 24 consists of a ring oscillator having an odd number of gates designated 40-48, and a buffer output stage 50. In the preferred embodiment of the present invention, while only five inverter gates are specifically shown, in actuality a fifteen gate ring oscillator arrangement is utilized in the preferred embodiment of the present invention, the structure of which is well known to one of ordinary skill in the art. Each gate of current to voltage converter 24 is an I²L inverter having a common injector line 52 supplied by injector current input 22. The frequency of operation for the ring oscillator is dependent solely on the propagation delay of the inverters, and the propagation delay of the inverters are controlled by varying this injector current.

FIG. 4 is a graph showing typical frequency characteristics for the fifteen gate ring oscillator of the preferred embodiment as a function of current. It can be seen from one endpoint of the graph for that an individual gate injector current of 0.1 uA, which corresponds to a 1.5 uA total injector current being supplied to the fifteen gate ring oscillator by voltage to current converter 16, an operating frequency of approximately 6 KHz is obtained. For an individual gate current of 100 uA, which corresponds to a 1.5 mA total injector current being supplied to the fifteen gate ring oscillator by voltage to current converter 16, an operating frequency of approximately 1 MHz is obtained. It will be appreciated by one of ordinary skill in the art that more or less gates may be employed in the ring oscillator, thereby providing correspondingly lower or higher operating frequency ranges for equivalent gate propagation delays.

Returning to FIG. 3, the output of the ring oscillator is taken from any one of the individual gates, such as gate 48 and supplied to the input of an I²L buffer 50. Buffer 50, as shown in the figure has three collectors coupled together to provide oscillator output 26, thereby increasing its drive capability. It will be appreciated by one of ordinary skill in the art that fewer, or additional collectors may be provided, depending on the drive requirement of phase comparator 12 or divider 28. If the inputs of phase comparator 12 or divider 28 are buffered, buffer 50 would not be required.

It will thus be appreciated that by the present invention, output currents $I_2$-$I_N$ can be adjusted to provide a range of I²L injector currents by adjusting the reference frequency to phase locking means 11. In so doing, a controlled range of propagation delays in the circuits being powered can be achieved. Additional adjustment of output currents $I_2$-$I_N$, and consequently circuit propagation delays, can be provided by multiplying the emitter areas of transistors 30-34 relative to the emitter area of diode connected transistor 18, as is well known to one of ordinary skill in the art. By controlling the output current $I_2$-$I_N$, with a phase lock loop as described, process, temperature and operating voltage variations are eliminated, since the frequency of the ring oscillator is being held constant relative to the current reference signal and reference frequency. In so doing, digital I²L logic circuits can be designed having constant propagation delay characteristics. Because constant propagation delay characteristics can be obtained, as described, problems such as race conditions which ordinarily only show up over temperature or operating voltage excursions are eliminated in the logic circuit. Furthermore, injector currents can be optimally set, as the current reference of the present invention will automatically track process, temperature and operating voltage variations.

What has been described is a current reference having constant propagation delay characteristics, especially suited for use with I²L logic designs. While specific embodiments of this invention have been shown and described, further modifications and improvements will occur to those skilled in the art. All modifications which retain the basic underlying principles disclosed and claimed herein are within the spirit and scope of the present invention.

I claim:

1. A current reference generator for coupling to a source of a reference frequency signal, said current reference generator comprising:
    phase locking means, responsive to said reference frequency signal and to an operating frequency signal, for providing a current reference signal;
    a current to frequency converter, responsive to said current reference signal, for generating the operating frequency signal; and
    a current mirroring device, responsive to the current reference signal, for providing an output current essentially equal to the current reference signal.

2. The current reference generator according to claim 1 wherein said phase locking means comprises:
    a phase comparator, responsive to the reference frequency signal and to the operating frequency signal, for providing a phase error output signal;
    a filter, responsive to the phase error output signal, for providing a filtered phase voltage signal; and
    a voltage to current converter, responsive to the filtered phase voltage signal, for providing the current reference signal.

3. The current reference generator according to claim 1 wherein said current to frequency converter comprises a ring oscillator.

4. The current reference generator according to claim 3 wherein said ring oscillator comprises a plurality of inverter stages of odd number.

5. The current reference generator according to claim 4 wherein said number of inverter stages is substantially fifteen.

6. The current reference generator according to claim 2 wherein said filter is a low pass filter.

7. The current reference generator according to claim 1 wherein said current mirroring device is a PNP transistor.

8. The current reference generator according to claim 2 wherein said voltage to current converter further comprises a current mirror having a diode connected transistor coupled to the output of said converter for providing a reference voltage and a current mirroring transistor coupled to said diode connected transistor for providing the current reference signal.

9. The current reference generator according to claim 2 wherein said phase locking means further comprises a divider coupled to said phase comparator and responsive to the operating frequency signal for providing an equivalent operating frequency signal.

10. The current reference generator according to claim 9 wherein said divider generates power of 2 divisors.

11. The current reference generator according to claim 1 wherein said current reference signal varies from substantially 5 KHz to 1 MHz.

12. The current reference generator according to claim 1 wherein said current reference signal varies from substantially 1.5 uA to 1.5 mA.

13. A method of providing a current reference, having an external source for providing a reference frequency signal, said method comprising:
   generating a current reference signal;
   generating an operating frequency signal in response to the current reference signal;
   phase locking the operating frequency signal with the reference frequency signal to generate a corresponding current reference signal; and
   generating an output current proportional to the current reference signal.

14. The method according to claim 13 further comprising dividing the operating frequency signal to generate a lower equivalent operating frequency signal to match a lower reference frequency signal.

15. The method according to claim 13 further comprising:
   varying the reference frequency signal to adjust the current reference signal; and
   generating an output current essentially equal to the current reference signal.

* * * * *